(12) United States Patent
Yoshida et al.

(10) Patent No.: US 8,531,091 B2
(45) Date of Patent: Sep. 10, 2013

(54) APPARATUS FOR HOLDING PIEZOELECTRIC VIBRATOR

(75) Inventors: Takashi Yoshida, Hakusan (JP); Mikio Takimoto, Hakusan (JP); Masahiro Takano, Kanazawa (JP); Kenichi Hirosaki, Kanazawa (JP)

(73) Assignees: Nikko Company, Ishikawa (JP); Ishikawa Prefecture, Ishikawa (JP)

( * ) Notice: Subject to any disclaimer, the term of this patent is extended or adjusted under 35 U.S.C. 154(b) by 77 days.

(21) Appl. No.: 13/056,889

(22) PCT Filed: Oct. 30, 2008

(86) PCT No.: PCT/JP2008/069777
§ 371 (c)(1),
(2), (4) Date: Jan. 31, 2011

(87) PCT Pub. No.: WO2010/013361
PCT Pub. Date: Feb. 4, 2010

(65) Prior Publication Data
US 2011/0133606 A1    Jun. 9, 2011

(30) Foreign Application Priority Data
Aug. 1, 2008   (JP) .................................. 2008-199643

(51) Int. Cl.
*H01L 41/053*   (2006.01)
(52) U.S. Cl.
USPC ........... 310/356; 310/351; 310/352; 310/354; 310/355
(58) Field of Classification Search
CPC ...................................... H03H 9/09
USPC .................. 310/355, 356, 348, 354, 351, 352
See application file for complete search history.

(56) References Cited

U.S. PATENT DOCUMENTS

| | | | |
|---|---|---|---|
| 6,172,445 B1 * | 1/2001 | Heinz et al. .................... | 310/328 |
| 6,543,108 B1 * | 4/2003 | Itasaka ......................... | 29/25.35 |
| 7,067,964 B1 * | 6/2006 | Kosinski ....................... | 310/348 |
| 2005/0188766 A1 * | 9/2005 | Matsunaga et al. ........ | 73/504.14 |
| 2007/0229702 A1 * | 10/2007 | Shirono et al. ............... | 348/374 |
| 2008/0315726 A1 * | 12/2008 | Dollgast et al. .............. | 310/348 |

FOREIGN PATENT DOCUMENTS

| | | |
|---|---|---|
| JP | 2722211 B2 | 2/1990 |
| JP | 3311446 B2 | 6/1995 |
| JP | 11-346486 A | 12/1999 |
| JP | 2000-116162 A | 4/2000 |
| JP | 2004-297951 A | 10/2004 |
| JP | 2005-065358 A | 3/2005 |
| JP | 2007-124840 A | 5/2007 |
| JP | 2008-032445 A | 2/2008 |

* cited by examiner

*Primary Examiner* — Thomas Dougherty
*Assistant Examiner* — Bryan Gordon
(74) *Attorney, Agent, or Firm* — Sughrue Mion, PLLC

(57) ABSTRACT

A holding device for a piezoelectric vibrator including a support member (11) for separately accommodating a piezoelectric vibrator (1), a first plate spring member (13) which extends from a proximal end fixedly bonded to one side of the support member (11) so as to sandwich opposing sides of the piezoelectric vibrator (1) and is folded back to be fixedly bonded to the piezoelectric vibrator, and a second plate spring member (18) which extends from a proximal end fixedly bonded to another side of the support member (11) so as to sandwich the opposing sides of the piezoelectric vibrator (1) and is folded back to be fixedly bonded to the piezoelectric vibrator. The first plate spring member (13) and the second plate spring member (18) are integrated at portions fixedly bonded to the piezoelectric vibrator (1).

7 Claims, 6 Drawing Sheets

US 8,531,091 B2

APPARATUS FOR HOLDING PIEZOELECTRIC VIBRATOR

TECHNICAL FIELD

The present invention relates to a holding device for a rod-like piezoelectric vibrator having a square rod shape, a cylindrical shape, or other sectional shapes, which is used in an ultrasonic motor, an ultrasonic actuator, an ultrasonic machine, or the like using a piezoelectric element.

BACKGROUND ART

There has been developed, for example, an ultrasonic motor using a piezoelectric vibrator, as a driving device for replacing an electromagnetic motor. There is also known an ultrasonic machine including processing means formed at an output end of the piezoelectric vibrator to perform various types of contact processing. Both the ultrasonic motor and the ultrasonic machine use vibration energy of the vibrator as a driving force or a processing force. In those cases, the piezoelectric vibrator forms a resonance state to obtain a large amplitude when applied with a voltage of a frequency of a natural mode of vibration, to thereby give the driving force or the processing force for rotation, direct operation, or the like to an opposite member that makes frictional contact with the piezoelectric vibrator. Ultrasonic vibrators and ultrasonic motors that utilize this principle are described in detail in Patent Documents 1 to 5, for example.

The piezoelectric vibrator as described above needs to be mechanically supported by some means in a support member for implementation. In this case, it is important for the support means to have small vibration energy loss and no change in vibration characteristics. Further, the ultrasonic motors and the ultrasonic machines generally bring the tip of the vibrator into pressure contact with the opposite member (transport member or work piece) to give a vibration energy of the vibrator as the driving force or the processing force to the opposite member. Therefore, a pressure mechanism for pressing the opposite member while holding the vibrator is necessary.

As an example of the conventional holding structure for the piezoelectric vibrator, Patent Document 1 discloses an ultrasonic motor having a structure in which the piezoelectric vibrator is accommodated and supported in a frame-shaped guide case to be slidable in a pressing direction, and the guide case is pressed in the pressing direction by spring means to thereby bring the piezoelectric vibrator into press contact with the opposite member.

Referring to FIG. 11, the structure of the ultrasonic motor is described. A rectangular piezoelectric vibrator 1 accommodated in a guide case 25 is supported at its two positions corresponding to node portions by guide portions 25a and 25b of the case 25, and a protruding portion 26 of an inner end surface of the guide case 25 is brought into contact with an end opposite to an output end 28 of the piezoelectric vibrator 1 via an elastic member 27. A side of the guide case 25 is supported by a guide plate 29 on a fixed side to be slidable, and an end of the guide case 25 is pressed by a coil spring 30, to thereby bring the output end 28 of the piezoelectric vibrator 1 into press contact with a member to be driven (driven member) 31.

With this structure, a voltage of a predetermined frequency is applied to excite vibration of the piezoelectric vibrator. Therefore, the piezoelectric vibrator simultaneously makes flexural vibration and stretching vibration so that the output end of the piezoelectric vibrator makes elliptical vibration to be periodically brought into press contact with the driven member. The frictional force between the piezoelectric vibrator and the driven member causes the driven member to perform operation such as rotation and direct operation.

Patent Document 1: JP 11-346486 A
Patent Document 2: JP 3311446 B2
Patent Document 3: JP 2004-297951 A
Patent Document 4: JP 2000-116162 A
Patent Document 5: JP 2005-65358 A
Patent Document 6: JP 2722211 B2

DISCLOSURE OF THE INVENTION

Problem to be Solved by the Invention

The ultrasonic motor illustrated in FIG. 11 has the following structure. The piezoelectric vibrator is supported from two directions perpendicular to the pressing direction at node portions at which displacement due to the vibration of the piezoelectric vibrator 1 is the smallest to constrain the degrees of freedom other than the pressing direction. Further, the end opposite to the output end 28 for extracting output is brought into contact with the protruding portion 26 of the inner wall of the guide case 25 and the case itself is pressed by the coil spring 30 from the outside, to thereby restrict the displacement in the pressing direction. However, in this structure, the sides of the piezoelectric vibrator 1 and vibrator guiding portions 25a and 25b of the guide case 25 are not bonded to be fixed to each other, which leads to a change in vibration characteristics of the piezoelectric vibrator 1 due to slight slip or wear at the portions. Therefore, there occurs a problem in that stable drive output cannot be provided.

Further, the end of the piezoelectric vibrator 1 to be brought into contact with and pressed by the protruding portion 26 of the guide case 25 is not the node portion of vibration and vibrates in the same way as the output end 28 on the tip side, to thereby cause energy loss due to slip or the like. Further, the generally-used coil spring 30 is used as the pressure mechanism of the ultrasonic motor. Therefore, when a distance between the piezoelectric vibrator 1 and the driven member 31 is changed in relation to a plane precision of the driven member 31 to be brought into contact with the output end 28, the applied pressure generated by the coil spring 30 may also change. The applied pressure (pressing force) greatly affects the output in the case of the ultrasonic motor or the ultrasonic machine, and hence the change in the pressing force should be avoided as much as possible. However, this problem is difficult to solve when the applied pressure is applied by the coil spring as described above.

An object of the present invention is to provide a holding device for a piezoelectric vibrator, which eliminates the vibration energy loss and the change in vibration characteristics, and is capable of supplying stable output with high efficiency.

Another object of the present invention is to provide a holding device for a piezoelectric vibrator, which is capable of applying a fixed applied pressure to the piezoelectric vibrator with a structure that is reduced in cost and size and maintaining stable output.

Means for Solving the Problem

According to the present invention, there is provided a holding device for a piezoelectric vibrator, including at least two plate springs which are separated in a pressing direction and each has one end fixedly bonded to a side of the piezoelectric vibrator, the other end fixed to a support member, and a plate surface directed to the pressing direction of the piezoelectric vibrator.

According to a holding device for a piezoelectric vibrator of claim 2 of the present invention, in the configuration of claim 1, the plate springs mentioned above are fixedly bonded to the piezoelectric vibrator at positions corresponding to node portions at which displacement due to vibration of the piezoelectric vibrator is small.

In addition, according to a holding device for a piezoelectric vibrator of claim 3 of the present invention, in the configuration of claim 1 or 2, the plate springs mentioned above are equal in length to each other and arranged in parallel to each other.

In addition, according to a holding device for a piezoelectric vibrator of claim 4 of the present invention, in the configuration of any one of claims 1 to 3, the support member is elastically pressed by the plate springs in the pressing direction of the piezoelectric vibrator.

Further, according to a holding device for a piezoelectric vibrator of claim 5 of the present invention, in the configuration of any one of claims 1 to 4, the at least two plate springs are fixedly bonded to each of opposing sides of the piezoelectric vibrator.

According to claim 6 of the present invention, there is also provided a holding device for a piezoelectric vibrator, including at least two plate springs which are separated in a pressing direction and each has one end fixedly bonded to each of opposing sides of the piezoelectric vibrator, the other end fixed to a support member, and a plate surface directed to a direction perpendicular to planes including other sides at a right angle to the opposing sides of the piezoelectric vibrator, in which each of the plate springs is formed to have a length that is longer than a distance between the piezoelectric vibrator and the support member so that the plate springs are buckled when the piezoelectric vibrator is pressed.

The holding device for a piezoelectric vibrator according to claim 7 of the present invention is characterized in that it comprises a support member of a frame shape or a box shape for separately accommodating the piezoelectric vibrator; and a plate spring structure interposed between sides of the support member and the piezoelectric vibrator, in which the plate spring structure includes: a first plate spring member which extends from a proximal end fixedly bonded to one side of the support member so as to sandwich opposing sides of the piezoelectric vibrator across the opposing sides of the piezoelectric vibrator and is folded back to be fixedly bonded to the piezoelectric vibrator; and a second plate spring member which extends from a proximal end fixedly bonded to another side of the support member so as to sandwich the opposing sides of the piezoelectric vibrator across the opposing sides of the piezoelectric vibrator and is folded back to be fixedly bonded to the piezoelectric vibrator, and the first plate spring member and the second plate spring member are integrated with each other at portions fixedly bonded to the piezoelectric vibrator.

In addition, the holding device for a piezoelectric vibrator of claim 8 of the present invention is characterized in that, in the configuration of claim 7, the piezoelectric vibrator is held by the at least two plate spring structures separated in a pressing direction of the piezoelectric vibrator in the support member.

In addition, the holding device for a piezoelectric vibrator of claim 9 of the present invention is characterized in that, in the configuration of claim 7 or 8, the plate spring structure is interposed between the piezoelectric vibrator and the support member at a position corresponding to a node portion at which displacement due to vibration of the piezoelectric vibrator is small.

Further, the holding device for a piezoelectric vibrator of claim 10 of the present invention is characterized in that, in the configuration of any one of claims 7 to 9, the plate spring structure has a plate surface which is generally directed to a pressing direction of the piezoelectric vibrator.

In addition, the present invention is also applicable to a piezoelectric vibrator generally having a rod-like shape, which has a rectangular shape or a polygonal shape in lateral section, or which has a circular shape or an elliptical shape in lateral section.

Effects of the Invention

According to the present invention, it is possible to obtain the holding device for the piezoelectric vibrator, which eliminates the vibration energy loss and the change in vibration characteristics, and is capable of supplying stable output with high efficiency. It is also possible to realize the holding device for the piezoelectric vibrator, which is capable of applying a fixed applied pressure to the piezoelectric vibrator and maintaining stable output with a structure that is reduced in size.

BEST MODES FOR CARRYING OUT THE INVENTION

Hereinafter, embodiments of the present invention are described with reference to the attached drawings.

First Embodiment

FIG. 1 are views illustrating a holding device for a rectangular piezoelectric vibrator according to a first embodiment of the present invention, of which FIG. 1(*a*) is a side sectional view, and FIG. 1(*b*) is a sectional view taken along the line A-A of FIG. 1(*a*). A piezoelectric vibrator 1 according to this embodiment is a vibrator of a square rod shape having a rectangular lateral section, and includes a protruding portion 2 formed on an output surface 1*a* at a tip thereof to be brought into press contact with an opposite member such as a driven member or a work piece (not shown in FIG. 1). Note that, when configured as an ultrasonic machine, the protruding portion 2 of the output surface 1*a* is formed as a protruding portion suitable for processing operation or attached with a suitable processing tool depending on the processing form. Note that, in all of the following embodiments, the shape of the piezoelectric vibrator is described as the rectangular piezoelectric vibrator having the rectangular lateral section, but the present invention is also applicable to a piezoelectric vibrator having a polygonal shape, a cylindrical shape, or an elliptical shape in lateral section. Further, the following embodiments describe a rod-like piezoelectric vibrator having an equal thickness over the entire length, but the present invention is also applicable to the rod-like piezoelectric vibrator of variable thickness. The present invention also encompasses the piezoelectric vibrator of such form.

A support member 3 is provided at a side of the rectangular piezoelectric vibrator 1 as a fixed side, and a pair of parallel plate springs 5 are provided between the support member 3 and the side of the piezoelectric vibrator 1. In this case, ends of each of the plate springs 5 are respectively bonded to be fixed to the side of the piezoelectric vibrator 1 and a wall surface of the support member 3. Each of the plate springs 5 is provided so that its plate surface 5*a* is directed to a pressing direction of the piezoelectric vibrator 1, that is, a plate thickness direction of the plate springs 5 is aligned with the pressing direction (direction of the arrow F) of the piezoelectric vibrator 1, and the pair of plate springs 5 are equal in thickness, width, and length. Note that, in the present invention, the pair of plate springs 5 do not necessarily need to be equal in thickness and width, and the pair of plate springs may be equal in length and different in thickness and width.

It is preferred that each of the plate springs 5 with respect to the piezoelectric vibrator 1 be fixedly bonded at a node portion at which the vibration amplitude of the piezoelectric vibrator 1 is the smallest. This is schematically described with reference to FIG. 3 illustrating how the piezoelectric vibrator 1 vibrates. In the rectangular piezoelectric vibrator 1 applied with a voltage of a frequency of a natural mode of vibration, composite vibration of flexion and stretching occurs across the vibrator, and elliptical vibration is induced at an output end 4 for applying pressure load to the opposite member.

Meanwhile, the piezoelectric vibrator 1 has a part that does not vibrate at a predetermined position in a longitudinal direction, and this position is referred to as a node of vibration. Such node portion 6 may occur at one position or a plurality of positions in the longitudinal direction depending on the mode of vibration, but the first embodiment describes an example in which the node portions occur at two positions near each end of the vibrator 1. The pair of plate springs are bonded to be fixed to the two positions at the side of the piezoelectric vibrator so as to support such node portions 6.

In the first embodiment, an initial position of the opposite member is previously set so that the protruding portion of the output surface of the piezoelectric vibrator is brought into press contact therewith at a predetermined pressing force. Note that, FIG. 1(a) is a side sectional view illustrating a state before the press contact, and FIG. 1(c) illustrates a state at the time of operation, that is, the time when the protruding portion 2 of the piezoelectric vibrator 1 and an opposite member 7 start press contact.

In this configuration, the plate springs 5 and the piezoelectric vibrator 1 are bonded to be fixed to each other. Therefore, no wear or slip occurs between the plate springs 5 and the piezoelectric vibrator 1, and it is possible to generate a stable output without a change in vibration characteristics. Further, each of the plate springs 5 has its plate surface 5a directed to the pressing direction and hence has appropriate flexibility with respect to the pressing direction, which does not restrict the vibration of the vibrator 1 and causes small energy loss. Further, the stiffness in directions other than the pressing direction is sufficiently high because of the form of the plate springs 5, and a stable applied pressure may be applied in the pressing direction. Therefore, there is no need for an additional pressure mechanism using a coil spring or the like, and it is possible to realize a holding device that is reduced in cost and size.

Note that, in the above-mentioned embodiment, there has been described the form in which the piezoelectric vibrator 1 is supported on one side by the two parallel plate springs, but the piezoelectric vibrator 1 may be supported by three or more plate springs. Also in that case, it is preferred that each of the plate springs be fixedly bonded to a node portion of the vibrator.

Modified Example 1

FIG. 2 is a side sectional view illustrating Modified Example 1 of the first embodiment. In this example, pairs of parallel plate springs 5 and 8 are fixedly bonded to opposing side surfaces of the piezoelectric vibrator 1 having a square rod shape at the positions of the node portions 6 (FIG. 3) of the piezoelectric vibrator 1, respectively. Plate spring ends 5b and 8b of the respective plate springs 5 and 8 opposite to the piezoelectric vibrator 1 are bonded to be fixed to the support member 3. Plate surfaces 5a and 8a of all the four plate springs 5 and 8 are directed to the pressing direction of the piezoelectric vibrator, and the four plate springs 5 and 8 are provided in parallel to each other. As in the case described with reference to FIG. 1(c), at the start of operation when the protruding portion 2 of the output surface 1a of the piezoelectric vibrator 1 is brought into press contact with the opposite member, an initial position is set so that the piezoelectric vibrator 1 is slightly pressed by the opposite member in a direction opposite to the pressing direction. At this position, initial applied pressures of spring forces of the plate springs 5 and 8 are applied between the protruding portion 2 of the piezoelectric vibrator 1 and the opposite member.

Second Embodiment

FIG. 4(a) is a side sectional view of a holding device for a rectangular piezoelectric vibrator according to a second embodiment of the present invention, and FIG. 4(b) is a sectional view taken along the line B-B of FIG. 4(a). Further, FIG. 5 is a side sectional view at the time of operation, when the protruding portion of the output surface of the piezoelectric vibrator is brought into press contact with the opposite member. As illustrated in FIGS. 4(a) and 4(b), one end of each pair of parallel plate springs 9 and 10 is bonded to be fixed to corresponding one of opposing side surfaces 1b and 1c of the piezoelectric vibrator 1 having a square rod shape, and the other end of each of the plate springs 9 and 10 is bonded to be fixed to the support member 3 on the fixed side as in Modified Example 1 of the first embodiment, but in the second embodiment, each of the plate springs 9 and 10 is formed to be longer than a distance d between the piezoelectric vibrator 1 and the support member 3. Further, the position to be fixedly bonded to the side surface of the piezoelectric vibrator 1 is closer to the output surface 1a of the piezoelectric vibrator 1 than the position to be fixedly bonded to the support member 3. In other words, at a state before the start of being operated, each of the plate springs 9 and 10 is inclined toward the output surface 1a of the piezoelectric vibrator 1.

Further, plate surfaces 9a and 10a of the plate springs 9 and 10 are formed to be directed substantially to the pressing direction of the piezoelectric vibrator 1. More specifically, the plate surfaces 9a and 10a (FIG. 4(b)) of the plate springs 9 and 10 are formed on planes perpendicular to planes including other side surfaces 1h at a right angle with respect to the side surfaces of the piezoelectric vibrator 1 fixedly bonded to the plate springs.

Under the state in which the piezoelectric vibrator 1 starts to be operated, the protruding portion 2 of the output surface 1a of the piezoelectric vibrator 1 is pressed against the opposite member 7 such as a driven member or a work piece while the support member 3 is pushed toward the opposite member 7. This buckles the plate springs 9 and 10 supporting the piezoelectric vibrator 1 in a V-shaped form as illustrated in FIG. 5 so that the protruding portion 2 of the piezoelectric vibrator 1 takes a form of being brought into press contact with the opposite member 7 at a predetermined pressing force. In this state, the piezoelectric vibrator 1 is applied with a voltage of a frequency of a predetermined mode of vibration to cause the protruding portion 2 of the output surface to output vibration.

The plate springs buckled as described above have non-linear spring characteristics. FIG. 6(a) illustrates the non-linear spring characteristics, and FIG. 6(b) illustrates normal spring characteristics. In the normal-spring characteristics, a load applied to the spring and the displacement of the spring shows a proportional relationship according to the Hookes' law. Meanwhile, in the characteristics of non-linear spring, the change in the load becomes substantially constant after a displacement exceeds a certain level as shown in FIG. 6(a). Therefore, the initial setting to displace a non-linear spring so as to press the piezoelectric vibrator against the opposite member is set to P a displacement within a range where the load is almost constant ($\Delta X1$).

In the case of a support spring having the normal spring characteristics in the same displacement portion, an amount of change in load $\Delta F1$ is large with respect to an amount of change in displacement $\Delta X1$. Therefore, when applied to an ultrasonic motor or the like, the pressure applied to the opposite member by the piezoelectric vibrator proportionally changes with the variation in pressing amount, with the result that the variation in applied pressure is too large to provide stable operation. However, when supported by the buckled plate springs 9 and 10 as illustrated in FIG. 4 and FIG. 5, a pressure may be applied under a constant load even when the position of the output surface 1a of the piezoelectric vibrator 1 changes. Accordingly, for example, in a case where the ultrasonic motor is used to directly operate the opposite member, a plane precision of the opposite member 7 to be brought into contact with the piezoelectric vibrator 1 may be relaxed to thereby increase a moving distance of the opposite member 7 and stabilize a moving speed thereof.

Modified Example 2

In the second embodiment described above, there has been described the example in which the plate springs are fixedly bonded to one pair of opposing side surfaces of the piezoelectric vibrator. However, in a modified example of the second embodiment, there may be employed a structure in which plate springs to be buckled in a pressing setting as described above may be attached to two pairs of opposing side surfaces, that is, four side surfaces of the piezoelectric vibrator. By employing the constant load portion of the non-linear spring characteristics, a constant pressure may be applied even when the distance between the opposite member, which is a moved member or a work piece, and the piezoelectric vibrator (contact position of the vibrator in the pressing direction) changes in a certain area. Therefore, according to the ultrasonic motor and the ultrasonic machine of the present invention, a stable frictional force or a stable processing force may be supplied to the opposite member.

Third Embodiment

FIG. 7 is a longitudinal sectional view of a holding device for a rectangular piezoelectric vibrator according to a third embodiment of the present invention, and FIG. 8 is a perspective view thereof. Note that, in FIG. 8, for the purpose of clarity, the support member on the fixed side, to which a plate spring structure to be described later is fixedly bonded, is omitted in the figure. FIG. 9 is an enlarged perspective view of the plate spring structure in the third embodiment. Further, FIG. 10 is a side view of the plate spring structure according to the third embodiment illustrated in FIG. 9. As can be seen from the figures, the holding device of the third embodiment includes a box-shaped support member 11 accommodating the rectangular piezoelectric vibrator 1 in a separate state. A through hole 11a is formed in one end of the support member 11, and the protruding portion 2 formed on the output surface 1a of the piezoelectric vibrator 1 partially protrudes from the through hole 11a. The piezoelectric vibrator 1 is supported at two portions corresponding to the above-mentioned node portions of the piezoelectric vibrator 1 by a plate spring structure 12 to inner walls 11b and 11c of the box-shaped support member 11, respectively. When a pressing external force is applied by a spring force of the plate spring structure 12 to the protruding portion 2 of the piezoelectric vibrator 1, an elastic reaction force is generated. Note that, the plate surface 12a of the plate spring structure 12 is generally directed to the pressing direction of the piezoelectric vibrator 1.

The plate spring structure 12 includes first and second plate spring members 13 and 18 integrally coupled with each other.

The first plate spring member 13 includes a wide proximal end 14 fixedly bonded to one side wall 11b of the support member 11. A pair of strip portions 15 extend from the proximal end 14 so as to sandwich opposing sides 1d of the piezoelectric vibrator 1 across the sides id, and are folded back in a bent shape at a position of a side of the piezoelectric vibrator 1 opposite to the proximal end 14 to be fixedly bonded to the sides 1d of the piezoelectric vibrator 1. Note that, in this embodiment, folded-back portions 16 of the pair of strip portions 15 are integrally coupled with each other while being in contact with a side 1e of the piezoelectric vibrator 1 opposite to the proximal end 14, and this portion (portion denoted by the reference numeral 17) is also bonded and fixed to the side 1e.

The second plate spring member 18 includes a wide proximal end 19 fixedly bonded to another side wall 11c of the support member 11, that is, the side wall 11c of the support member 11 opposite to the side to which the proximal end 14 of the first plate spring member 13 is fixedly bonded. A pair of strip portions 20 extend from the proximal end 19 so as to sandwich the opposing sides 1d of the piezoelectric vibrator 1 across the sides 1d, and are folded back in a bent shape at a position of a side 1f of the piezoelectric vibrator 1 opposite to the proximal end 19 of the second plate spring member 18 to be fixedly bonded to the piezoelectric vibrator 1. Note that, as illustrated in FIG. 8, the strip portions 20 of the second plate spring member 18 extend outside the strip portions 15 of the first plate spring member 13 across the sides 1d of the piezoelectric vibrator 1.

Similarly to the first plate spring member 13, folded-back portions 21 of the pair of strip portions 20 of the second plate spring member 18 are also integrally coupled with each other while being in contact with the sides 1d of the piezoelectric vibrator opposite to the proximal end 19 of the second plate spring member 18 (portion denoted by the reference numeral 22), and these portions are fixedly bonded to the sides 1d and 1f. Further, portions extending from the folded-back portions 16 and 21 of the first and second plate spring members 13 and 18 along the sides 1d of the piezoelectric vibrator 1, across which the strip portions 15 and 20 of the first and second plate spring members 13 and 18 extend, are integrated with each other at positions of the sides 1d to be fixedly bonded to the sides 1d. Note that, for each of the plate spring members 13 and 18, at the portion 17, 22 at which the pair of folded-back portions 16, 21 are integrally coupled, a flat plate portion 23 to be brought into close contact with the side wall 1e, 1f of the piezoelectric vibrator 1 is formed, and this portion of the flat plate portion 23 is also bonded and fixed to the side wall 1e, 1f of the piezoelectric vibrator 1, to thereby fixedly bond each plate spring member 13, 18 and the piezoelectric vibrator 1 more reliably.

The elastic pressing force of the piezoelectric vibrator 1 in the pressing direction on the support member 11 is brought about by the spring characteristics of the four strip portions 15 and 20 (two on each of the opposing sides, four in total) of the plate spring structure 12 surrounding the piezoelectric vibrator 1. The strength of the elastic force also depends on the length of the strip portions 15 and 20. Generally, when the flexibility in the pressing direction is to be increased, the length of the plate spring should be increased. However, the structure of the present invention is configured so that the strip portions 15, 20 extend along the sides 1*d* of the piezoelectric vibrator 1 and are folded back at the side 1*f*, 1*e* of the piezoelectric vibrator 1 opposite to the side of the proximal end 14, 19. Therefore, the overall structure may be reduced in size, and the flexibility in the pressing direction may be ensured at the same time.

The proximal ends 14 and 19 of the plate spring structure 12 are fixedly bonded to the support member 11 at positions closer to the side opposite to the output surface 1*a* in the pressing direction than the positions at which the plate spring structure 12 is fixedly bonded to the piezoelectric vibrator 1. Therefore, the strip portions 15 and 20 are configured to extend in an inclined state toward the pressing direction. Further, as shown in the figures, the strip portions 15 and 20 of the first and second plate spring members 13 and 18 are opposite to each other in inclining directions and cross each other on the sides 1*d* of the piezoelectric vibrator 1. With this configuration, the plate spring structure 12 has the non-linear spring characteristics as described in FIG. 6(*a*) with respect to the pressing load applied from the protruding portion 2 of the output surface of the piezoelectric vibrator 1, and by setting the initial position of the piezoelectric vibrator 1 in a displacement range (ΔX1) in which the variation in pressing load (ΔF2) is small, the applied pressure of the protruding portion of the output surface to the opposite member may be stabilized. This allows the piezoelectric vibrator to be pressed at a substantially fixed load even under a condition in which the position to be in contact with the opposite member varies, to thereby provide a stable frictional force or a stable processing force in the ultrasonic motor for friction driving or the ultrasonic machine. For example, in a case where the piezoelectric vibrator is brought into press contact with a plane portion of a moved member for feeding the moved member, the plane precision of the moved member may be relaxed to enable an operation of moving for an accordingly large distance.

In addition, the stiffness is high in directions other than the pressing direction in which flexibility is attained, and the load may be easily adjusted by changing the length of the strip portions of the plate spring structure. Further, no wear occurs between the piezoelectric vibrator and the support member and the piezoelectric vibrator is stably positioned, with the result that the vibration energy loss is small as compared to a conventional structure using the coil spring.

Note that, also in the third embodiment, it should be understood that the number of the plate spring structures is not limited to two, and three or more plate spring structures may be provided depending on the size and capacity of the piezoelectric vibrator. Further, the plate spring structure may be easily produced by press stamping and folding a flat plate, which leads to various effects that have been unattainable by the conventional structure, such as realizing the holding device that is reduced in size and cost.

DESCRIPTION OF SYMBOLS

Figure 1:
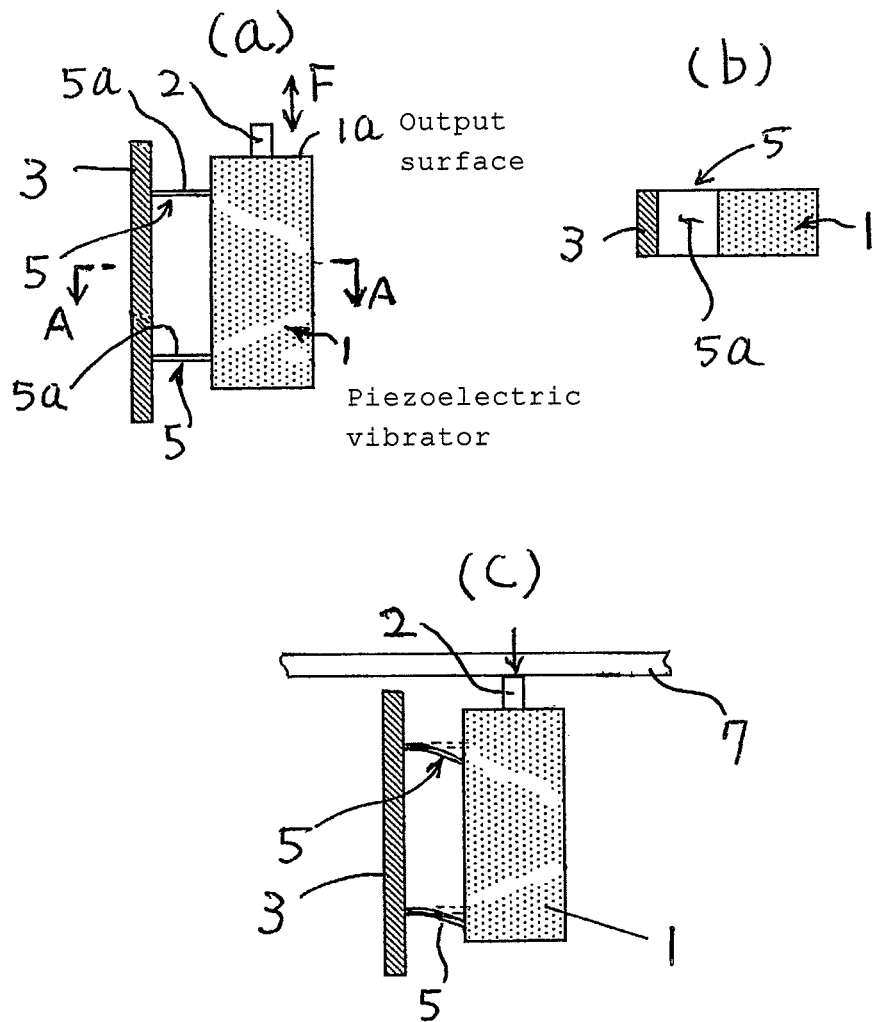
FIG. 1 are views illustrating a holding device for a rectangular piezoelectric vibrator according to a first embodiment of the present invention.
Figure 2:
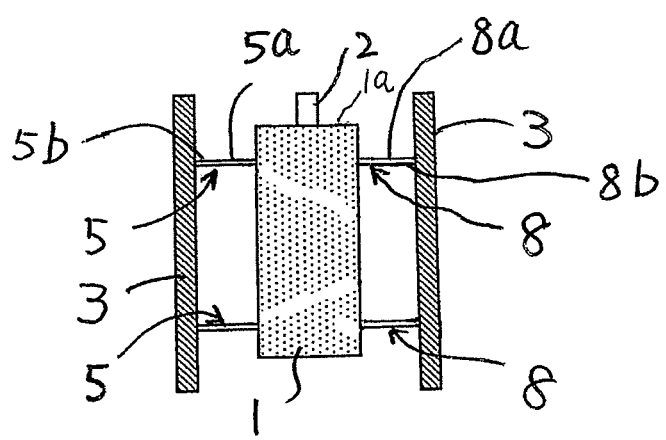
FIG. 2 is a side sectional view illustrating Modified Example 1 of the first embodiment.
Figure 3:
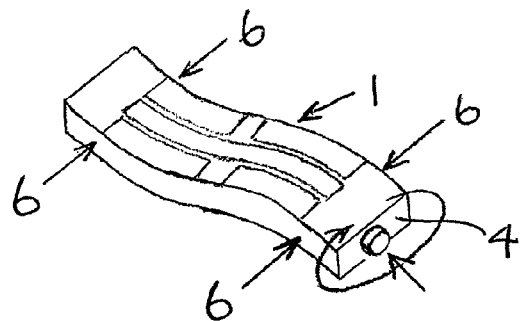
FIG. 3 is a view schematically illustrating a vibration form of the piezoelectric vibrator used in an ultrasonic elliptical vibration actuator.
Figure 4:
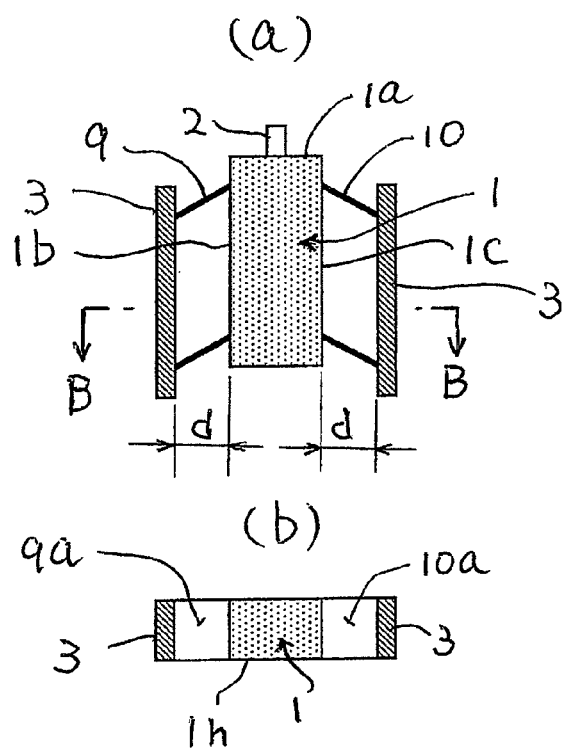
FIG. 4 are views illustrating a holding device for a rectangular piezoelectric vibrator according to a second embodiment of the present invention.
Figure 5:
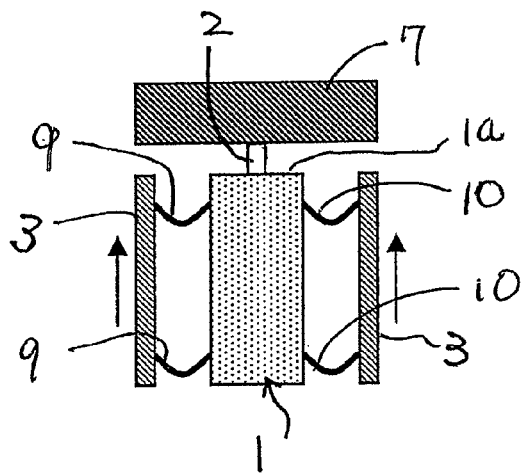
FIG. 5 is a side sectional view illustrating a state at a time when the holding device for the rectangular piezoelectric vibrator according to the second embodiment of the present invention is in operation.
Figure 6:
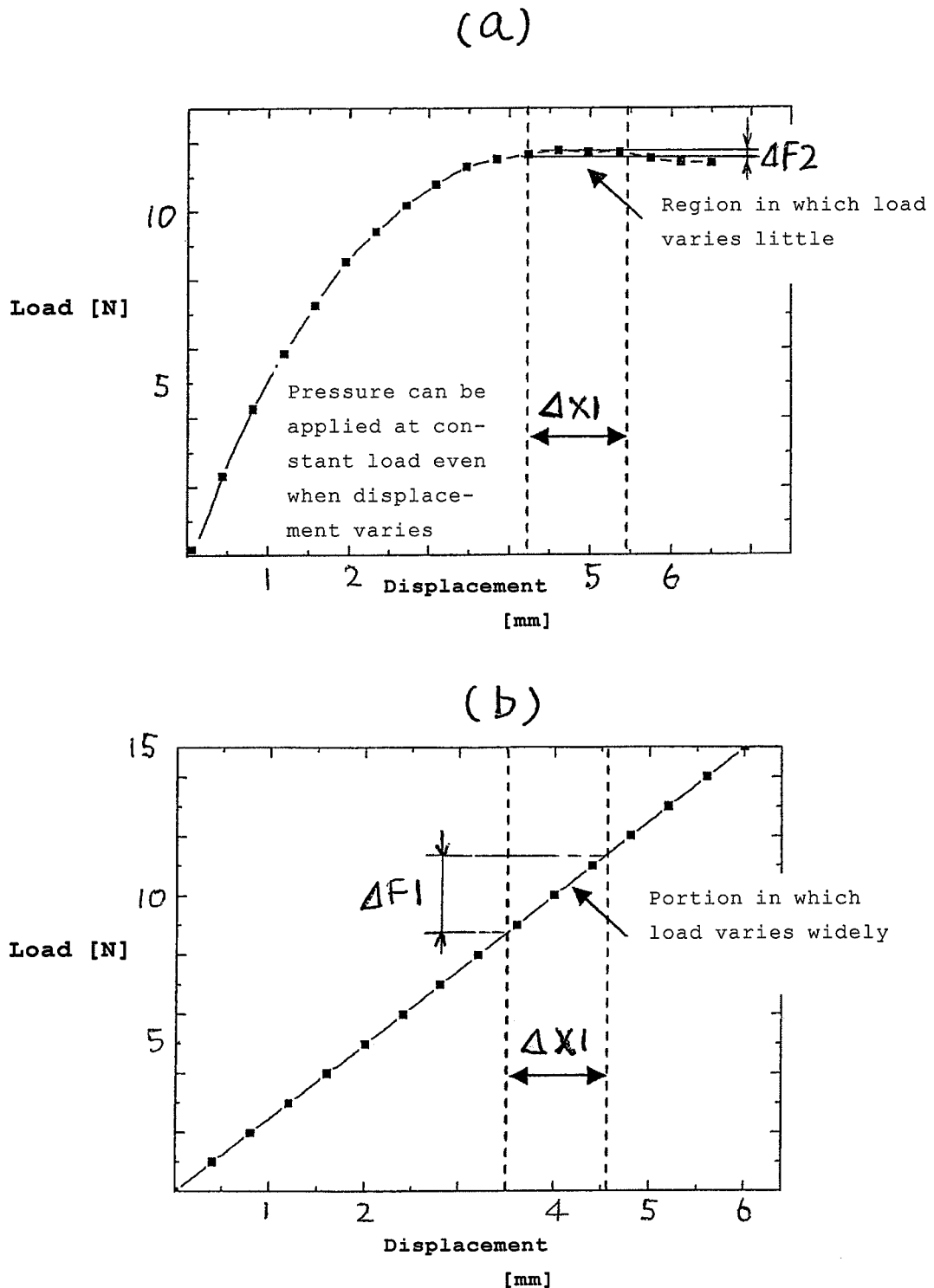
FIG. 6 are graphs illustrating non-linear spring characteristics of a plate spring member of the holding device according to the present invention and displacement-load characteristics of a normal spring, respectively.
Figure 7:
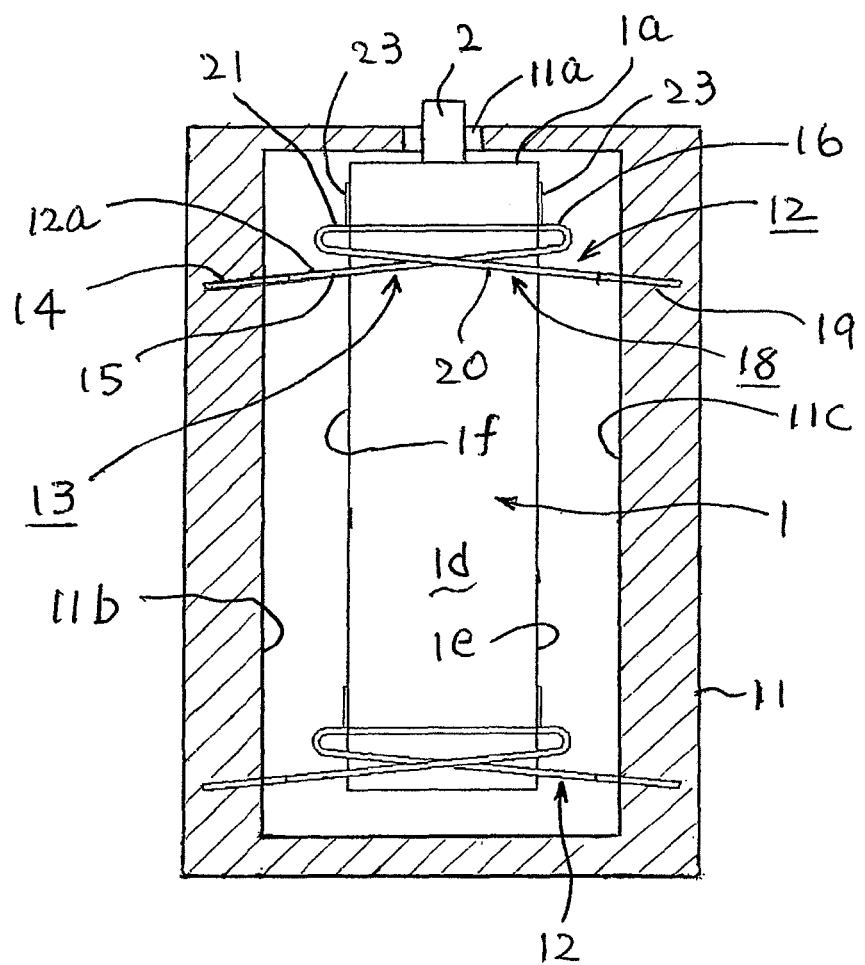
FIG. 7 is a longitudinal sectional view of a holding device for a rectangular piezoelectric vibrator according to a third embodiment of the present invention.
Figure 8:
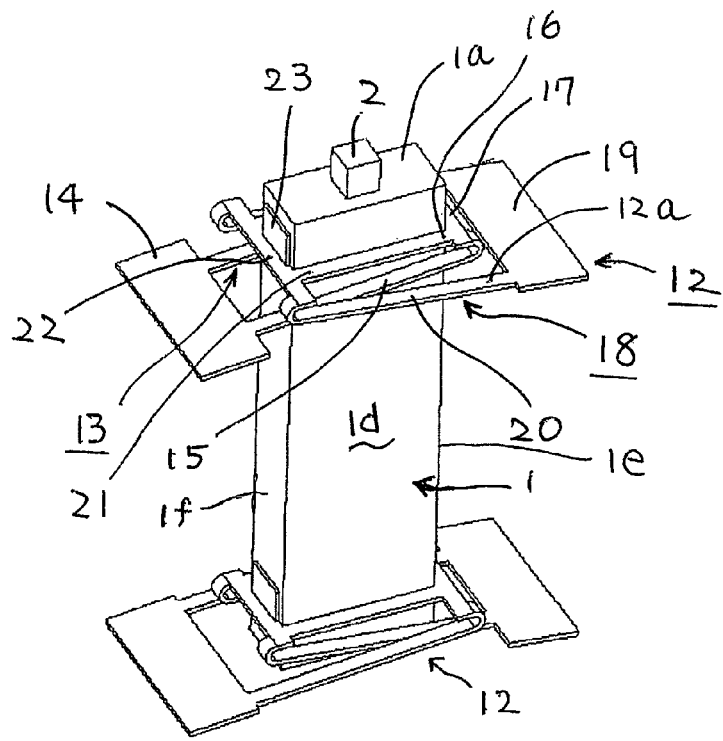
FIG. 8 is a perspective view of the holding device for the rectangular piezoelectric vibrator illustrated in FIG. 7 in a state in which a support member is omitted.
Figure 9:
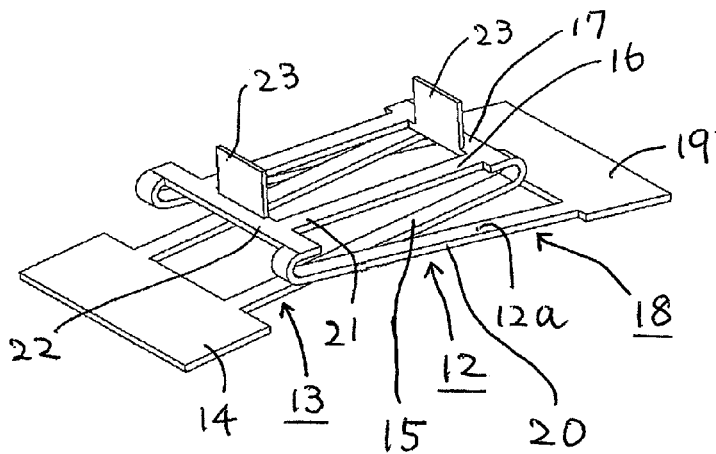
FIG. 9 is an enlarged perspective view of a plate spring structure according to the present invention.
Figure 10:
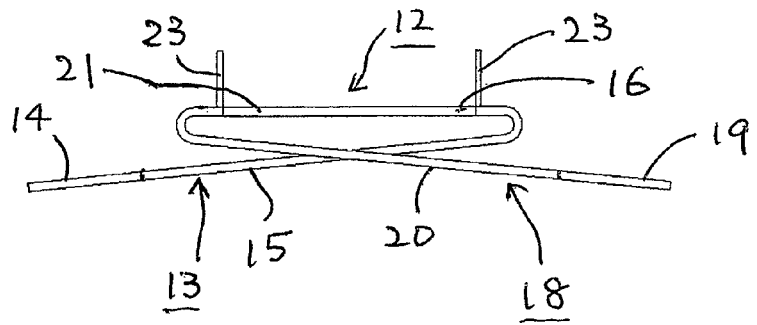
FIG. 10 is a side view of FIG. 9.
Figure 11:
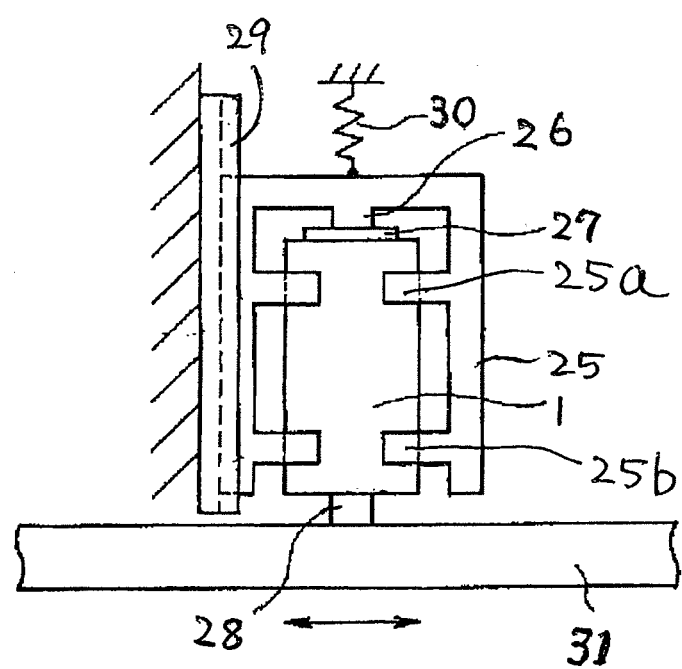
FIG. 11 is a side view of an ultrasonic motor using conventional holding means for a piezoelectric vibrator.

1 piezoelectric vibrator
1*a* output surface
3, 11 support member
5, 8, 9, 10 plate spring
6 node portion of piezoelectric vibrator
7 opposite member
12 plate spring structure
13 first plate spring member
14, 19 proximal end
15, 20 strip portion
16, 21 folded-back portion
18 second plate spring member

The invention claimed is:

1. A holding device for a piezoelectric vibrator, comprising:
    a support member of a frame shape or a box shape for separately accommodating the piezoelectric vibrator; and
    a plate spring structure interposed between sides of the support member and the piezoelectric vibrator,
    wherein the plate spring structure comprises:
        a first plate spring member which extends from a proximal end fixedly bonded to one side of the support member so as to sandwich opposing sides of the piezoelectric vibrator across the opposing sides of the piezoelectric vibrator and is folded back to be fixedly bonded to the piezoelectric vibrator; and
        a second plate spring member which extends from a proximal end fixedly bonded to another side of the support member so as to sandwich the opposing sides of the piezoelectric vibrator across the opposing sides of the piezoelectric vibrator and is folded back to be fixedly bonded to the piezoelectric vibrator, and
    wherein the first plate spring member and the second plate spring member are integrated with each other at portions fixedly bonded to the piezoelectric vibrator.

2. The holding device for a piezoelectric vibrator according to claim 1, wherein the piezoelectric vibrator is held by the at least two plate spring structures separated in a pressing direction of the piezoelectric vibrator in the support member.

3. The holding device for a piezoelectric vibrator according to claim 1, wherein the plate spring structure is interposed between the piezoelectric vibrator and the support member at a position corresponding to a node portion at which displacement due to vibration of the piezoelectric vibrator is small.

4. The holding device for a piezoelectric vibrator according to claim 1, wherein the plate spring structure has a plate surface which is generally directed to a pressing direction of the piezoelectric vibrator.

5. A holding device for a piezoelectric vibrator, wherein composite vibration of flexion and stretching occurs across the vibrator, comprising two pairs of plate springs (four plate springs) which are equal in length to each other, separated to each other and arranged in parallel to a pressing direction of the piezoelectric vibrator; and each have one end fixedly bonded to the piezoelectric vibrator at positions corresponding to the node portions at which displacement due to vibration of the piezoelectric vibrator is small, the other end fixed to a support member, wherein the support member is elastically pressed by the plate springs in the pressing direction of the piezoelectric vibrator; and wherein the position at which the end of each of the plate springs is fixedly bonded to the piezoelectric vibrator is closer to the output surface of the piezoelectric vibrator than the position at which the other end of the plate springs is fixedly bonded to the support member, so that the plate springs are buckled when the piezoelectric vibrator is pressed.

6. The holding device for a piezoelectric vibrator according to claim 5, wherein the piezoelectric vibrator comprises a rod-like piezoelectric vibrator which has a rectangular shape or a polygonal shape in lateral section.

7. The holding device for a piezoelectric vibrator according to claim 5, wherein the piezoelectric vibrator comprises a rod-like piezoelectric vibrator which has a circular shape or an elliptical shape in lateral section.

* * * * *